US008779579B2

(12) United States Patent
Alhayek et al.

(10) Patent No.: US 8,779,579 B2
(45) **Date of Patent: *Jul. 15, 2014**

(54) THERMAL DISSIPATION IN CHIP

(71) Applicant: Continental Automotive Systems, Inc., Auburn Hills, MI (US)

(72) Inventors: Iyad Alhayek, Schaumburg, IL (US); Gerry Bianco, Elgin, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/715,152

(22) Filed: Dec. 14, 2012

(65) Prior Publication Data

US 2013/0105962 A1 May 2, 2013

Related U.S. Application Data

(63) Continuation-in-part of application No. 11/693,280, filed on Mar. 29, 2007, now Pat. No. 8,373,266.

(51) Int. Cl.

*H01L 23/48* (2006.01)
*H01L 23/36* (2006.01)
*H01L 23/367* (2006.01)

(52) U.S. Cl.

CPC ................ *H01L 23/36* (2013.01); *H01L 23/48* (2013.01); *H01L 23/3672* (2013.01)

USPC .......................................................... 257/706

(58) Field of Classification Search

CPC ..... H01L 23/36; H01L 23/48; H01L 23/3672; H01L 2023/405

USPC ............ 257/706, 712, 686; 438/122; 361/700

See application file for complete search history.

(56) References Cited

U.S. PATENT DOCUMENTS

| | | | | |
|---|---|---|---|---|
| 5,481,268 | A * | 1/1996 | Higgins | 342/70 |
| 5,585,671 | A * | 12/1996 | Nagesh et al. | 257/697 |
| 5,751,063 | A * | 5/1998 | Baba | 257/723 |
| 6,078,502 | A * | 6/2000 | Rostoker et al. | 361/723 |
| 6,607,942 | B1 * | 8/2003 | Tsao et al. | 438/122 |
| 2007/0008679 | A1 * | 1/2007 | Takahasi et al. | 361/600 |
| 2010/0225363 | A1 * | 9/2010 | Takahashi et al. | 327/109 |

* cited by examiner

*Primary Examiner* — Nathan Ha

(57) ABSTRACT

A system for dissipating heat from a semiconductor board includes a first substrate including an opening formed therein, a second substrate attached to a surface of the first substrate, and a microchip positioned in the opening and bumped to the second substrate. The system further includes a heat sink directly adhered to the microchip. A method of manufacturing a heat dissipating semiconductor board includes forming an opening in a first substrate and positioning a microchip in the opening. The method further includes directly adhering the microchip to a heat sink, bonding the microchip to a second substrate and boding a surface of the first substrate to the second substrate.

18 Claims, 5 Drawing Sheets

272 200 274 242 220 240 235 210 244 260 240 225 270 260 255 280 245

THERMAL DISSIPATION IN CHIP

CROSS-REFERENCE TO RELATED APPLICATIONS

This application is a continuation in-part of U.S. patent application Ser. No. 11/693,280, filed Mar. 29, 2007. The disclosure of the above application is incorporated herein by reference.

FIELD OF THE INVENTION

The present invention related generally to thermal dissipation from microchips and in particular to thermal dissipation in chip substrates.

BACKGROUND OF THE INVENTION

Heat generation is an undesired byproduct of operating microchips. Typically, excess heat flows to a heat sink through thermal vias and wire bonds. However, as wiring systems become more complex, designers are increasingly being challenged to place the thermal vias, especially in applications with limited space. These problems are exacerbated in high temperature operating environments. While simple components such as FETS, diodes and low power integrated chips (IC) have solutions, problems exist for high pincount devices such as microchips, flash memory, SRAM, etc.

Thus, in automotive engine applications, such as automotive transmissions, designers face a daunting challenge. In such an environment, often approaching 140 Celsius, the maximum operating temperature can be as low as 150 Celsius, leaving a window of only 10 Celsius. While cooling systems can help alleviate these problems, such systems add both cost, as well as weight, to the system, and can therefore be undesirable.

FIG. 1 illustrates a prior art circuit board 100 including substrate 105. A plurality of flip chips. IC's and other electronic devices 140 are mounted to substrate 105 using appropriate techniques. In addition, microchip 110 is wirebonded 120 to the substrate, with wirebond 120 providing at least some heat sink functionality for microchip 110. As can be seen in FIG. 1, microchip 110 includes a significant footprint on the substrate 105, especially when including the wirebond 120.

Therefore, it would be desirable to provide a system for dissipating heat that would overcome the aforementioned and other disadvantages.

SUMMARY OF THE INVENTION

One aspect of the invention provides a system for dissipating heat from a semiconductor board includes a first substrate including an opening formed therein, a second substrate attached to an upper surface of the first substrate, and a microchip positioned in the opening and bumped to the second substrate. The system further includes a heat sink directly adhered to the microchip.

Another aspect of the invention provides method of manufacturing a heat dissipating semiconductor board includes forming an opening in a first substrate and positioning a microchip in the opening. The method further includes directly adhering the microchip to a heat sink, bonding the microchip to a second substrate and bonding a surface of the first substrate to the second substrate.

Yet another aspect of the invention provides a system for dissipating heat from a semiconductor board includes a first substrate including an opening formed therein, a second substrate attached to an upper surface of the first substrate, and a microchip positioned in the opening and bumped to the second substrate. The system further includes a mean for directly adhering a microchip to the heat sink.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PREFERRED EMBODIMENTS

Figure 2:
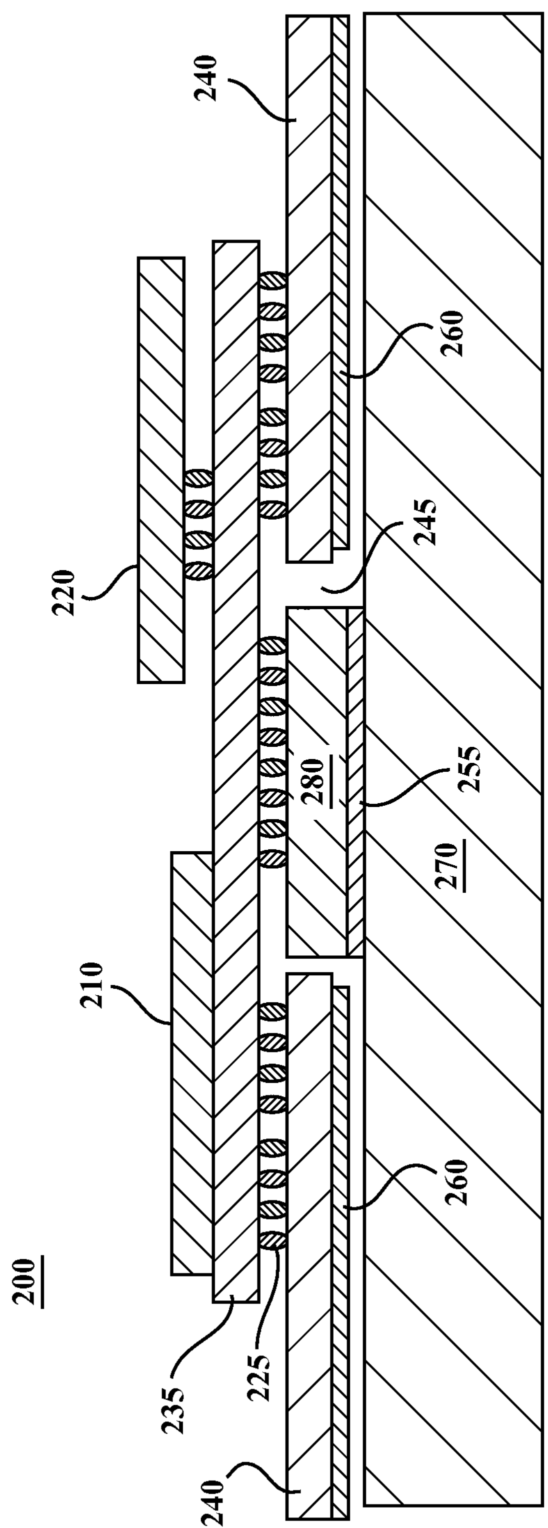
FIG. 2 illustrates an embodiment of a system for thermal dissipation, in accordance with an aspect of the invention.

FIG. 2 illustrates one embodiment of a system 200 for thermal dissipation in accordance with one aspect of the invention. System 200 includes heat sink 270, microchip 280 and first substrate 240. First substrate 240 includes an opening 245 formed within first substrate 240. Microchip 280 and first substrate 240 are bumped to second substrate 235 with bumps 225. First substrate 240 can be a low density ceramic board or a Flame Resistant 4 ("FR-4") board, among other appropriate structures. Second substrate 235 can be a High Density Interconnection ("HDI") board, Low Temperature Co-fired Ceramic ("LTCC") board, or a ceramic board, among other appropriate structures. Alternatively, the first substrate and second substrate can be the same type of board, such as HDI, LTCC, Fr-4, ceramic, low density ceramic, or the like.

Additionally, at least one electronic device, such as integrated chip 210 and flip chip 220 can be operatively attached to second substrate 235. Operative attachment can be made by any appropriate joining technique, such as bumping, soldering, or a direct connection. Any appropriate material can be used for bumping in accordance with this disclosure, including gold and solder. In one embodiment, at least one chip is bumped to the second substrate on a first side of the second substrate, and the microchip is bumped to the second substrate on a second side of the second substrate, with the first side opposing the second side. In such embodiments, the chips and microchip are mounted to opposing sides of the second substrate, such that the microchip can be directly mounted to the heat sink with a high thermal conductivity adhesive. Any appropriate devices can be used to bump, such as the K&S WaferPro III Stud Bumper. Chips can be bonded to the first substrate or second substrate with the UltraSonic FCX501 FlipChip Bonder, available from Panasonic.

Figure 6:
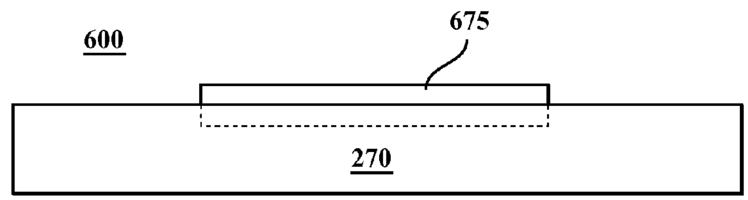
FIG. 6 illustrates an embodiment of a heat sink for thermal dissipation, in accordance with an aspect of the invention.

Heat sink 270 is any structure to which heat will flow from the operative electronic components such as chips 210, 220 and microchip 280. In one embodiment, heat sink 270 is a structure made of aluminum. In one embodiment, heat sink 270 is a transmission case. In another embodiment, heat sink 270 is directly attached to a transmission case. In one embodiment, heat sink 270 includes at least one ridge sized to fit within opening 245. FIG. 6 illustrates ridge 675 on heat sink 270. In other embodiment, heat sink 270 includes fins or other physical characteristics to increase surface area or improve heat flow.

In one embodiment, first substrate 240 is isolated from heat sink 270 by a low thermal conductivity adhesive 260, such as an adhesive with a thermal conductivity of less than approximately 0.9 W/m-K. In one embodiment, heat sink 270 is directly adhered to microchip 280 with a high thermal conductivity adhesive 255, wherein the high thermal conductivity adhesive 255 conducts greater than approximately 2.5 W/m-K.

Figure 3:
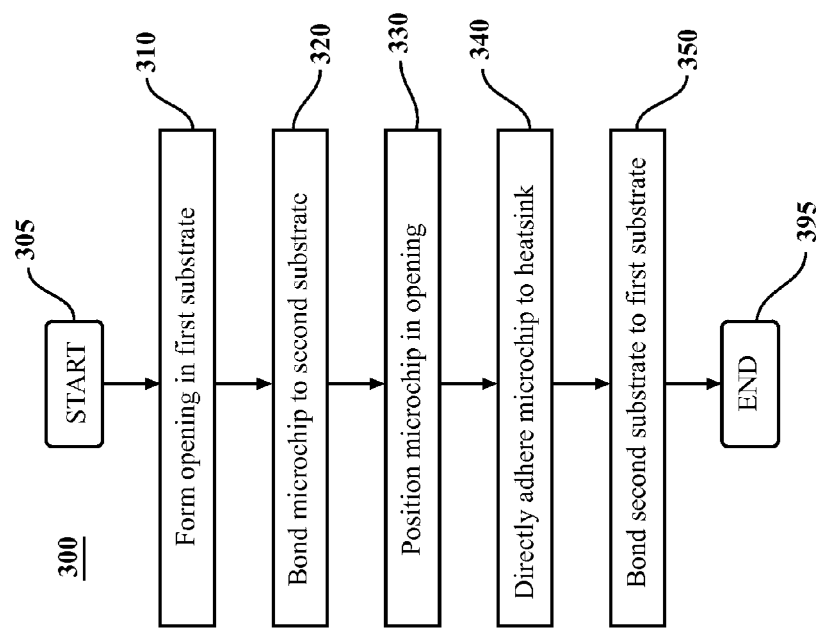
FIG. 3 illustrates one embodiment of a method for manufacturing a heat dissipating semiconductor board, in accordance with one aspect of the invention.

FIG. 3 illustrates one embodiment of a method 300 for manufacturing a heat dissipating semiconductor board, in accordance with one aspect of the invention. Method 300 begins at 305.

At step 310, method 300 forms an opening, such as opening 245, in a first substrate, such as first substrate 240. The opening can be substantially circular, polygonal, or any other appropriate shape. In one embodiment, the opening is sized to accommodate a microchip. In one embodiment, the opening is sized to accommodate a microchip with a gap between the microchip and the first substrate. In some embodiments, the gap can be filled with underfill, depending on design. The opening can be created by dicing the substrate, or by attaching a plurality of substrates together to define the opening. A microchip is bonded to the second substrate at step 320 and the microchip is positioned in the opening at step 330. The microchip is then directly adhered to a heat sink at step 340. In one embodiment, a high thermal conductivity adhesive adheres the microchip to the heat sink. The second substrate is bonded to the first substrate at step 350. Method 300 ends at step 395.

Figure 4:
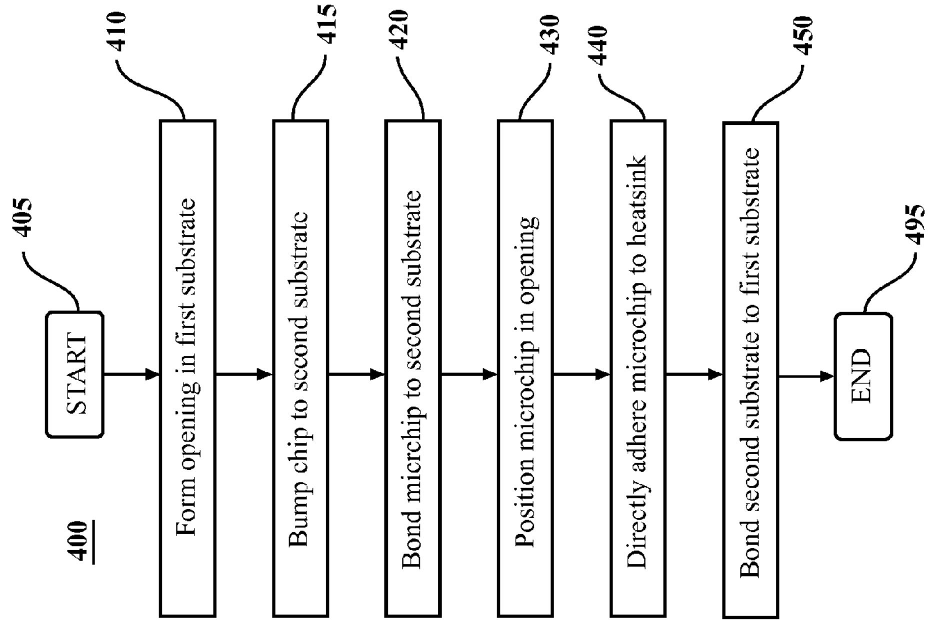
FIG. 4 illustrates one embodiment of a method for manufacturing a heat dissipating semiconductor board, in accordance with one aspect of the invention.

FIG. 4 illustrates one embodiment of a method 400 for manufacturing a heat dissipating semiconductor board, in accordance with one aspect of the invention. Method 400 begins at 405.

At step 410, method 400 forms an opening, such as opening 245, in a first substrate, such as first substrate 240. The opening can be substantially circular, polygonal, or any other appropriate shape. In one embodiment, the opening is sized to accommodate a microchip. In one embodiment, the opening is sized to accommodate a microchip with a gap between the microchip and the first substrate. In some embodiments, the gap can be filled with underfill, depending on design. The opening can be created by dicing the substrate, or by attaching a plurality of substrates together to define the opening. A microchip is bonded to the second substrate at step 420 and the microchip is positioned in the opening at step 430. The microchip is then directly adhered to a heat sink at step 440. In one embodiment, a high thermal conductivity adhesive adheres the microchip to the heat sink. The second substrate is bonded to the first substrate at step 450.

At least one chip is bumped to the second substrate at step 415. The chip is bumped to a first side of the second substrate (such as the top side) while the microchip is bumped to a second side of the second substrate (such as the bottom side), and the first side of the second substrate opposes the second side of the second substrate.

Method 400 ends at step 495.

Figure 7:
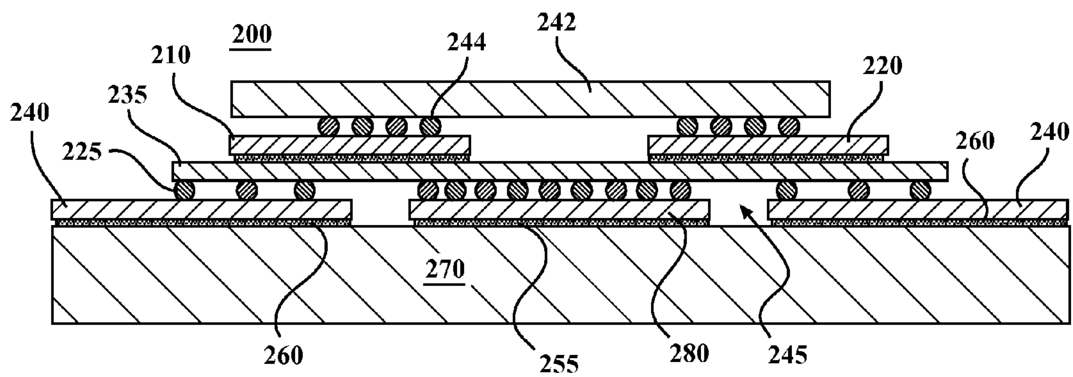
FIG. 7 illustrates a first alternate embodiment of a system for thermal dissipation, in accordance with an aspect of the invention.

Another embodiment of the invention is shown in FIG. 7, with like numbers referring to like elements. In this embodiment, there is a third substrate 242 bumped to the integrated chip 210 and the flip chip 220 with the use of the bumps 244. Although it is shown that the third substrate 242 is bumped to the integrated chip 210 and the flip chip 220, it is within the scope of the invention the third substrate 242 may be attached to the chips 210,220 is other ways, such as bumping, soldering, or a direct connection. Also, any appropriate material may be used for bumping in accordance with this disclosure, such as, but not limited to, solder or gold bumps. Similar to the first substrate 240, the second substrate may be made of low density ceramic board, or FR-4 board, among other appropriate materials. In other embodiments, the third substrate 242 is made of HDI, LTCC, Fr-4, ceramic, low density ceramic, or the like.

Figure 8:
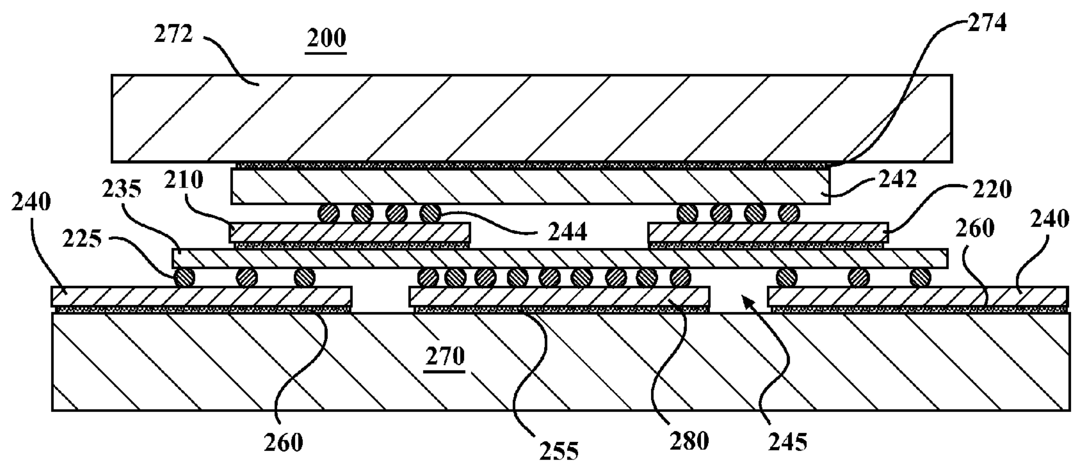
FIG. 8 illustrates a second alternate embodiment of a system for thermal dissipation in accordance with an aspect of the invention.

With regard to FIG. 8, this embodiment not only includes the third substrate 242, but also includes a second heat sink 272 connected to the third substrate 242 through the use of an adhesive 274. The adhesive 274 has a thermal conductivity that is generally in the range of 0.7 W/m-k to 4.0 W/m-K. In one embodiment, the adhesive 274 is a low thermal conductivity adhesive, such an adhesive with a thermal conductivity of less than approximately 0.9 W/m-K. In another embodiment, the adhesive 274 is a high thermal conductivity adhesive, having a thermal conductivity of greater than approximately 2.5 W/m-K. The second heat sink 272 may be used to provide heat dissipation away from not only the third substrate 242, but also the chips 210,220.

One of the heat sinks 270,272 may be formed as part of a transmission case. More specifically, the first heat sink 270 may be integrally formed as part of a transmission case, and the second heat sink 272 is a separate component from the transmission case. The second heat sink 272 may also have one or more fins integrally formed as part of the second heat sink 272 to provide even greater heat dissipation. Alternatively, each of the heat sinks 270,272 may be integrally formed as part of a transmission case to provide even greater amounts of heat dissipation. In yet another alternate embodiment, while it has already been shown that the first heat sink 270 may have a ridge 675 sized to fit within the opening 245, it is within the scope of the invention that the heat sink 270 may have the ridge 675, and may be used along with the second heat sink 272 to provide heat dissipation.

Use of this disclosure enables both improved heat flow from the microchip to the heat sink, and also design of bare dies to be mounted on LTCC boards. Removal of heat spreaders saves both space and cost. Higher power items like a microprocessor, would be stud bumped to the bottom of a small HDI/LTCC board and the die would be thermally attached to the baseplate with high conductivity adhesive. Lower power components, such as IC's and flip chips can be attached to the top of the small substrate, with thermal vias for heat transfer as needed. This keeps the bottom available for signal I/O balls and allows the substrate to remain small. Higher density is achieved by using IC's as flip chips on both sides of the board, and solder balls, would be the interconnect to the large substrate, similar to a BGA.

In addition to functional advantages, the disclosure herein can contribute to cost advantages as well. For example, high density routing is primarily on the second substrate, so that the larger substrate, i.e. first substrate 240 can be a simpler and less costly design. Replacing gold wirebonding with gold stud bumping will reduce costs due to less material and higher throughput and no outsourced flip chip logistical issues.

Figure 1:
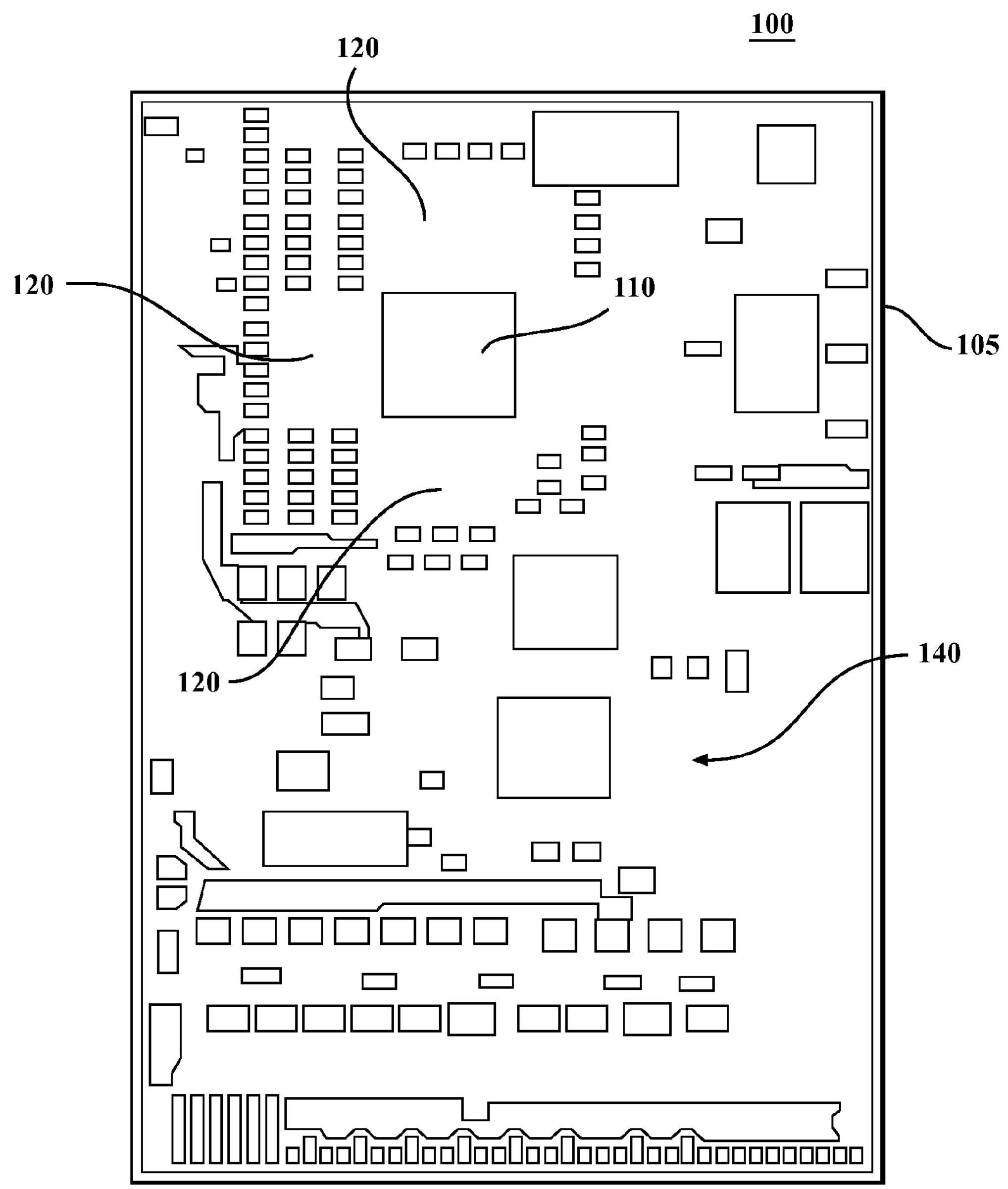
FIG. 1 illustrates one embodiment of a first substrate in accordance with the prior art.
Figure 5:
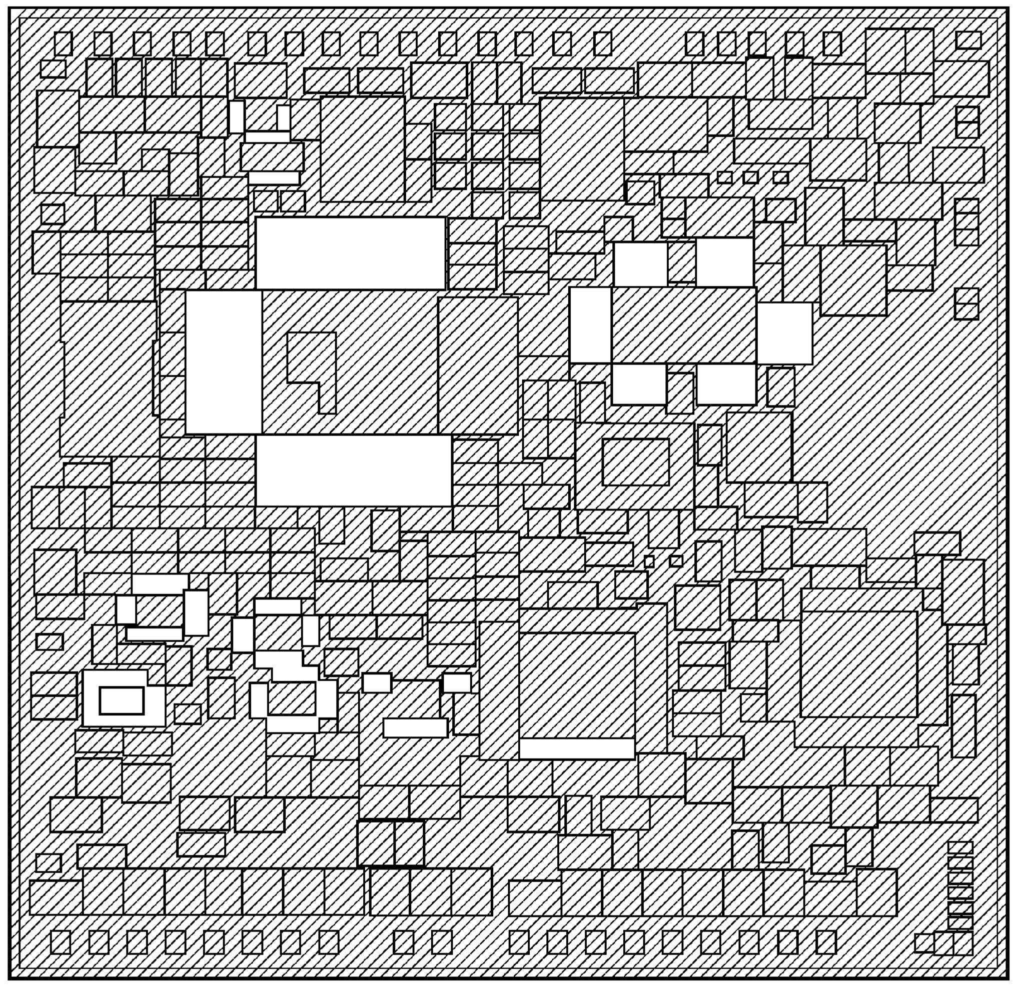
FIG. 5 illustrates one example of space saved on a board, in accordance with the teachings of the invention.

For example, an application of the teaching to the board depicted in FIG. 1 could result in a board space savings of 0.532 $in^2$ out of 4.58 $in^2$, FIG. 5 illustrates another board featuring significant space savings, wherein the white areas 502 represent saved space from the lack of wirebonding surrounding the wirebonded microchip.

While the teachings of this disclosure are applicable in any operating environment, it is anticipated that one operating environment is automotive, especially in a transmission or engine controller. Thus, the microchip can be a chip including instructions for operating a transmission. Alternatively, the microchip can be a chip including instructions for operating an engine.

It is important to note that the figures and description illustrate specific applications and embodiments of the present invention, and is not intended to limit the scope of the present disclosure or claims to that which is presented therein. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. An apparatus, comprising:

a system for dissipating heat, comprising:
- a first substrate;
- a second substrate connected to the first substrate;
- a microchip connected to the second substrate;
- at least one chip bumped to the second substrate;
- a third substrate connected to the at least one chip; and
- a first heat sink connected to the microchip such that the first heat sink dissipates heat away from the microchip.

2. The apparatus of claim 1, further comprising an opening formed as part of the first substrate, wherein the microchip is connected to the second substrate such that at least a portion of the microchip is located in the opening of the first substrate.

3. The apparatus of claim 1, further comprising a second heat sink connected to the third substrate, wherein the second heat sink dissipates heat from the third substrate.

4. The apparatus of claim 3, wherein at least one of the first heat sink or the second heat seat is integrally formed as part of a transmission case.

5. The apparatus of claim 3, wherein both of the first heat sink and the second heat sink are integrally formed as part of a transmission case.

6. The apparatus of claim 1, the first substrate being one selected from the group consisting of FR-4 board, low density ceramic board, and combinations thereof.

7. The apparatus of claim 1, the second substrate being one selected from the group consisting of an HDI board, a Low-Temperature Co-Fired Ceramic board, a ceramic board, and combinations thereof.

8. The apparatus of claim 1, the second substrate further comprising a first side and a second side, wherein the at least one chip is bumped to the first side of the second substrate, and the microchip is bumped to the second side of the second substrate, the first side opposing the second side.

9. The apparatus of claim 1, the at least one chip further comprising a first chip and a second chip, both the first chip and the second chip bumped to the second substrate, and the first chip and the second chip connected to the third substrate.

10. The apparatus of claim 1, further comprising a high thermal conductivity adhesive for connecting the first heat sink to the microchip, wherein the high thermal conductivity adhesive has a conductivity of greater than 2.5 W/m-K.

11. The apparatus of claim 1, further comprising a low thermal conductivity adhesive for connecting the first heat sink to the first substrate, wherein the low thermal conductivity adhesive has a conductivity of less than 0.9 W/m-K.

12. The apparatus of claim 1, further comprising an adhesive connecting the first heat sink to the first substrate, wherein the adhesive has a conductivity that is generally 0.7 W/m-k to 4.0 W/m-K.

13. A system for dissipating heat from at least one semiconductor board, comprising:
- a first substrate;
- an opening formed as part of the first substrate;
- a second substrate mounted to the first substrate;
- a microchip connected to the second substrate such that at least a portion of the microchip is located in the opening of the first substrate;
- at least one chip bumped to the second substrate;
- a third substrate connected to the at least one chip;
- a first heat sink connected to the microchip, the first heat sink dissipating heat away from the microchip; and
- a second heat sink connected to the third substrate, the second heat sink dissipating heat away from the third substrate.

14. The system for dissipating heat from at least one semiconductor board of claim 13, wherein at least one of the first heat sink or the second heat seat is integrally formed as part of a transmission case.

15. The system for dissipating heat from at least one semiconductor board of claim 13, wherein both of the first heat sink and the second heat sink are integrally formed as part of a transmission case.

16. A method for manufacturing a heat dissipating semiconductor board, comprising:
- providing a first substrate;
- providing a second substrate;
- providing a third substrate;
- providing a microchip;
- providing at least one chip;
- providing a first heat sink;
- providing a second heat sink;
- forming an aperture in the first substrate;
- bonding a surface of the first substrate to the second substrate;
- positioning at least a portion of the microchip in the aperture formed as part of the first substrate;
- connecting the microchip to the first heat sink and the second substrate, such that the first heat sink dissipates heat from the microchip;
- connecting the third substrate to the at least one chip; and connecting the second heat sink to the third substrate such that the second heat sink dissipates heat away from the third substrate.

17. The method of claim 16, further comprising the steps of integrally forming one of the first heat sink or the second heat sink with a transmission case.

18. The method of claim 16, further comprising the steps of integrally forming both of the first heat sink and the second heat sink with a transmission case.

* * * * *